United States Patent [19]
Paul et al.

[11] Patent Number: 5,924,021
[45] Date of Patent: Jul. 13, 1999

[54] FREQUENCY CONVERSION CIRCUIT AND METHOD FOR MILLIMETER WAVE RADIO

[75] Inventors: Jeffrey A. Paul; Chaim Warzman, both of Torrance; Raymond Santos, Jr., Long Beach; Richard T. Hennegan, Redondo Beach; Steve Blacketer, Torrance, all of Calif.

[73] Assignee: Raytheon Company, Lexington, Mass.

[21] Appl. No.: 08/707,168

[22] Filed: Sep. 3, 1996

[51] Int. Cl.[6] ................................... H04B 1/40
[52] U.S. Cl. .................. 455/209; 455/76; 455/84
[58] Field of Search .................. 455/20, 21, 22, 455/23, 75, 76, 83, 112, 113, 118, 131, 209, 84

[56] References Cited

U.S. PATENT DOCUMENTS

| | | | |
|---|---|---|---|
| 4,491,969 | 1/1985 | Datta | 455/75 |
| 4,703,520 | 10/1987 | Rozanski, Jr. et al. | 455/75 |
| 5,276,904 | 1/1994 | Mutzig et al. | |
| 5,410,747 | 4/1995 | Ohmagari et al. | 455/118 |
| 5,428,668 | 6/1995 | Dent et al. | 379/59 |
| 5,444,863 | 8/1995 | Torii | 455/83 |
| 5,495,255 | 2/1996 | Komatsu et al. | 342/175 |
| 5,657,344 | 8/1997 | Na | 455/76 |
| 5,717,719 | 2/1998 | Park et al. | 455/118 |

FOREIGN PATENT DOCUMENTS 0469898  5/1992  European Pat. Off. .

Primary Examiner—Reinhard J. Eisenzopf
Assistant Examiner—Sam Bhattacharya
Attorney, Agent, or Firm—Leonard A. Alkov; William C. Schubert; Glenn H. Lenzen, Jr.

[57] ABSTRACT

A frequency upconversion circuit in a millimeter wave radio transmitter uses a low frequency synthesizer and a parallel frequency mixing and multiplication network for converting a low frequency signal to a millimeter wave radio frequency (RF) signal. A frequency downconversion circuit in a millimeter wave radio receiver uses a low frequency synthesizer and a parallel frequency mixing and multiplication network for converting a millimeter wave RF signal to a low frequency signal.

11 Claims, 2 Drawing Sheets

FREQUENCY CONVERSION CIRCUIT AND METHOD FOR MILLIMETER WAVE RADIO

BACKGROUND OF THE INVENTION

1. Field of the Invention

This invention relates to frequency conversion that employs a combination of frequency mixing and multiplication for conversion between a low frequency modulation signal and a radio frequency (RF) signal in the millimeter wave range using a low frequency synthesizer.

2. Description of the Related Art

Millimeter wave radios require conversion of lower-frequency baseband modulation signals to millimeter wave radio frequency (RF) signals for transmission. A baseband modulation signal modulates an intermediate frequency (IF) wave by mixing the modulation signal with the IF wave from a local oscillator to produce a modulated IF signal, the frequency of which is the sum of the baseband frequency and the local oscillator's frequency.

There are two major conventional schemes to convert an IF signal to a millimeter wave RF signal for radio transmission. The first scheme involves direct multiplication of the frequency of the modulated IF signal to a millimeter wave frequency, as shown in FIG. 1. A modulating signal 2 at a low baseband frequency $f_{mod}$ is mixed with an IF wave 4 at a frequency $f_1$ in a mixer 6, which produces an upconverted modulated signal 8 at an intermediate frequency $f_{IF}$ equal to the sum of $f_{mod}$ and $f_1$. The IF signal is then fed into a frequency multiplier 10 which increases the frequency of the IF signal by multiplying $f_{IF}$ by N, resulting in an RF signal 12 at a millimeter wave frequency $f_{RF}$. This scheme of direct frequency multiplication is described in U.S. Pat. No. 5,495,255 for a frequency modulation (FM) radar system.

A major disadvantage of the direct frequency multiplication scheme in FIG. 1 for a millimeter wave radio is that the frequency multiplier 10 introduces nonlinearities when the modulated IF signal is multiplied by N, resulting in an RF signal 12 that has a distorted signal shape compared to the modulation signal. Direct multiplication is suitable for modulation schemes that are not amplitude sensitive, such as FM or frequency shift keying (FSK). However, direct multiplication is not suitable for modulation schemes that require linearity, such as amplitude modulation (AM) or high level quadrature amplitude modulation (QAM).

Another conventional scheme to produce an RF signal in the millimeter wave range is to use a millimeter wave synthesizer, as shown in FIG. 2. A baseband modulation signal 14 at a frequency $f_{mod}$ is mixed with an IF wave 16 at a frequency $f_1$ in a mixer 18 to produce a modulated IF signal 20 at a frequency $f_{IF}$. The IF signal 20 is then mixed with a millimeter wave 22 generated by a millimeter wave frequency synthesizer 24 in a high frequency mixer 26, which produces a modulated millimeter wave signal 28 at a frequency $f_{RF}$. This scheme is described in U.S. Pat. No. 5,428,668 for lower RF frequency cellular telephone applications.

The millimeter wave frequency synthesizer 24 in FIG. 2 is very expensive due to hardware complexity required for synthesizing millimeter wave frequencies directly. Moreover, a millimeter wave frequency synthesizer has a limited tuning bandwidth, and therefore is not suitable for wide bandwidth radios. If a multiple number of millimeter wave frequency synthesizers are used to cover a desired tuning bandwidth, the radio would be even more costly.

SUMMARY OF THE INVENTION

The present invention provides a frequency conversion circuit and method for converting a baseband modulation signal to a millimeter wave radio frequency (RF) signal and vice versa, using a low frequency synthesizer, a plurality of frequency multipliers, and a plurality of mixers.

In the radio transmitter, a modulated signal is first mixed with the synthesizer frequency of a low frequency synthesizer to produce a modulated synthesizer frequency. The synthesizer frequency is also multiplied in a cascade of frequency multipliers in a path parallel to the modulated synthesizer frequency signal to convert the synthesizer frequency to a millimeter wave frequency. This millimeter wave frequency is then mixed with the modulated synthesizer frequency to produce a modulated millimeter wave RF signal for transmission.

The radio receiver performs the reverse operation. A received RF signal is mixed with the multiplied synthesizer frequency and thereby downconverted to a lower modulated synthesizer frequency. This frequency is then mixed with the synthesizer frequency to produce a further downconverted frequency for reception.

This invention has two distinct characteristics that make it attractive for low cost commercial radios. First, the modulated signal is not frequency multiplied in any circuit path, thereby avoiding nonlinearities in the signal that would otherwise be introduced by frequency multipliers. Because this frequency conversion circuit basically preserves signal linearity, it can be used for a variety of modulation formats such as FM, AM and QAM.

A second advantage is that a low frequency synthesizer can be used, thus greatly reducing the circuit's cost. Because the tuning bandwidth of the low frequency synthesizer is multiplied by the composite multiplication factor of the cascaded frequency multipliers, a wide RF tuning bandwidth can be achieved with relatively narrow synthesizer tuning bandwidth. Therefore, one synthesizer in the frequency conversion circuit can cover the radio's full bandwidth, further reducing the circuit's cost.

These and other features and advantages of the invention will be apparent to those skilled in the art from the following detailed description, taken together with the accompanying drawings, in which:

DETAILED DESCRIPTION OF THE INVENTION

The present invention provides a frequency conversion circuit for a millimeter wave radio transmitter and receiver. The circuit concerns the use of a low frequency synthesizer and a combination of cascaded frequency multipliers and mixers to achieve conversion from a modulation signal to a millimeter wave RF signal for transmission, and vice versa for reception.

Figure 1:
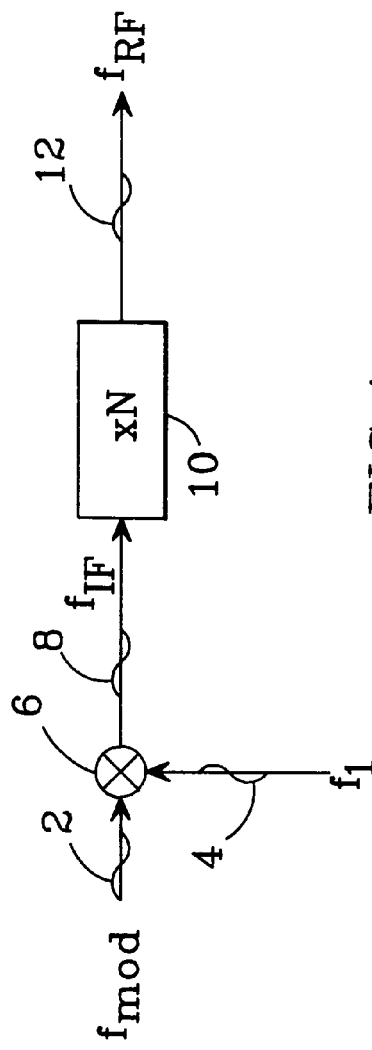
FIG. 1, described above, is a schematic diagram of a conventional millimeter wave radio transmitter using direct multiplication of an IF signal to generate an RF signal.
Figure 2:
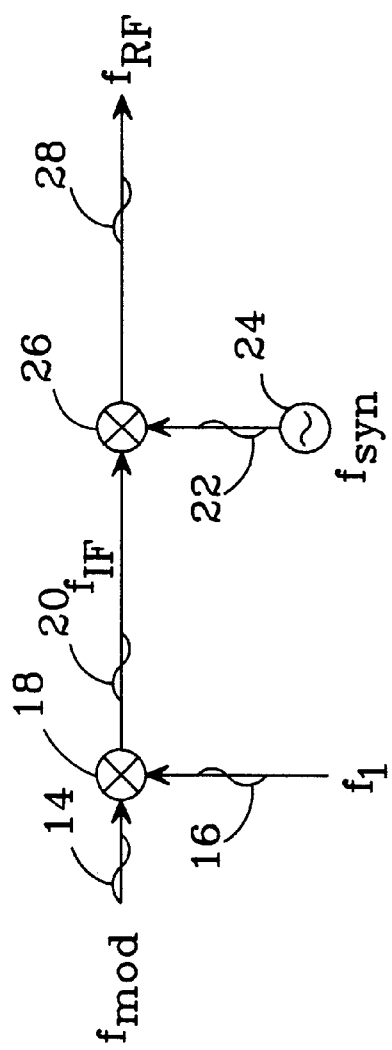
FIG. 2, described above, is a schematic diagram of a conventional millimeter wave radio transmitter using a millimeter wave frequency synthesizer.
Figure 3:
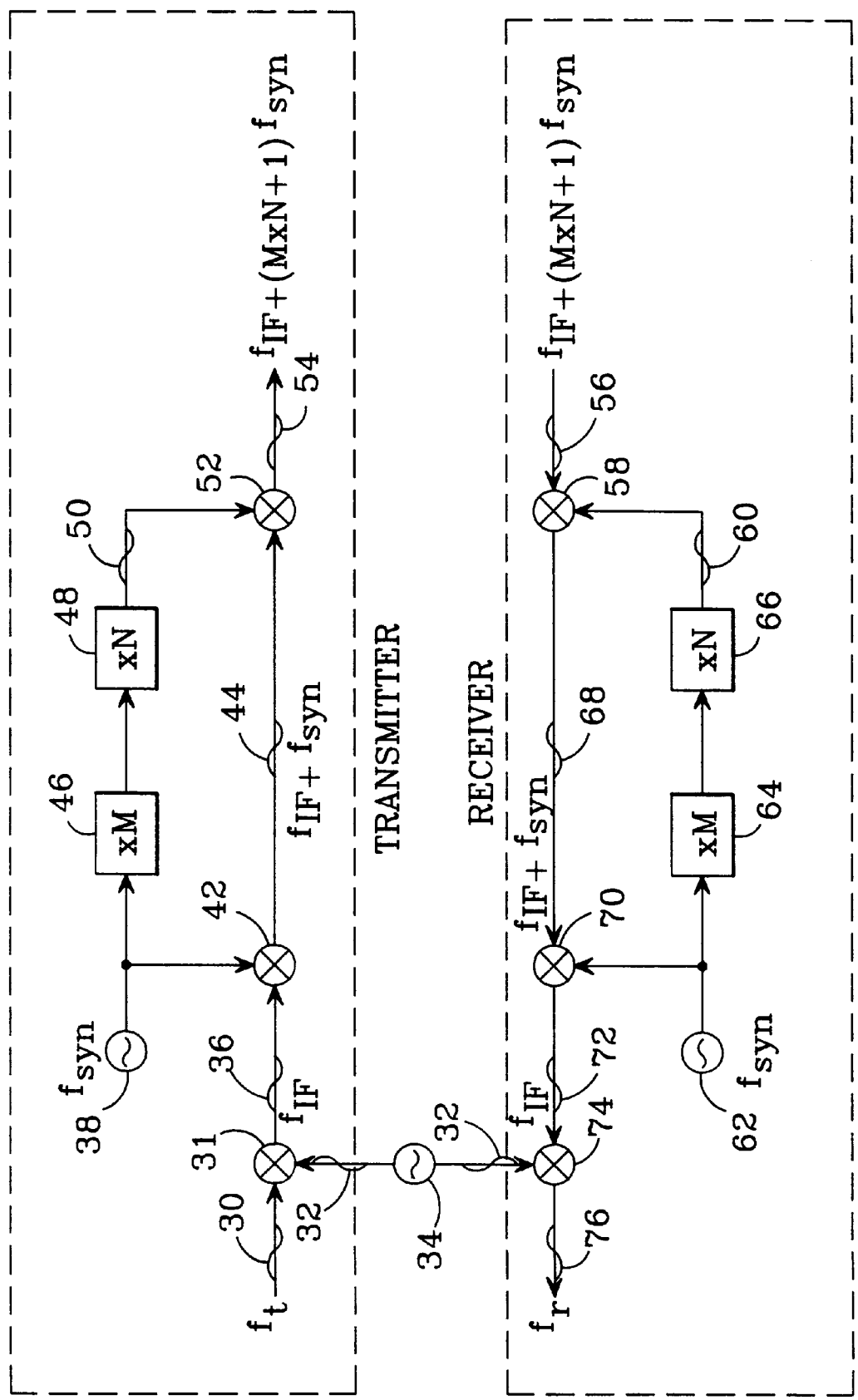
FIG. 3 is a schematic diagram of a millimeter wave radio transmitter and receiver in accordance with the invention that employ a combination of frequency multiplication and mixing using a low frequency synthesizer.

FIG. 3 is a schematic diagram of a preferred embodiment of the invention. The transmitter and receiver circuits are basically symmetrical. If the transmitter and receiver circuits are implemented in a single radio, identical mixer and multiplier components for corresponding functions may be used for both the transmitter and the receiver to simplify manufacture.

In the transmitter, a baseband modulation signal 30 at a frequency $f_r$ is mixed in a mixer 31 with an intermediate frequency (IF) wave 32 generated by a local oscillator 34 at a frequency $f_1$ to produce an IF signal 36 at a frequency $f_{IF}$, which is the sum of $f_r$ and $f_1$. The baseband modulation signal is preferably in the frequency range of 50–500 MHz. Although it is possible to convert a baseband modulation signal to an RF signal without the use of IF, it is preferred that the baseband modulation signal be converted to an IF signal first to allow for a wide tuning range if the baseband signal has a wide bandwidth. The local oscillator frequency $f_1$ is preferably much higher than the baseband frequency $f_r$, and is preferably in the range of 500 MHz to 3 GHz. It is further preferred that the IF frequency be approximately five times the baseband frequency of the modulation signal, so that the baseband modulation frequency is much smaller than the IF to allow for easy filtering and tuning. For example, if the frequency of the baseband modulation signal is 300 MHz, the IF frequency is preferably 1.5 GHz. The transmitter employs a low frequency synthesizer 38 that provides a synthesizer frequency $f_{syn}$, preferably in the range of 1–5 GHz. For example, if a desired millimeter wave RF is about 40 GHz, and a desired composite multiplication factor is 10, then the synthesizer frequency $f_{syn}$ should be about 4 GHz. The synthesizer frequency is mixed with the IF signal 36 in a mixer 42 to produce a signal 44 at a frequency that is the sum of $f_{IF}$ and $f_{syn}$. In another path, the synthesizer frequency is multiplied in a xM frequency multiplier 46 and a xN frequency multiplier 48 that are cascaded together to generate a multiplied frequency 50 that is M×N×$f_{syn}$, where M and N are positive integers. Preferably, the multiplication factors M and N are each no more than 5 to avoid excessive degradation in phase noise. It is further preferred that the multiplication factor in each of the multipliers equal 3, so that a frequency that is 9 times $f_{syn}$ is generated. The multiplied frequency 50 is then mixed with the $f_{IF}$+$f_{syn}$ signal 44 in a mixer 52 to generate a millimeter wave RF signal 54 at a frequency of $f_{IF}$+(M×N+1)×$f_{syn}$. The RF signal preferably has a frequency range of 30–90 GHz. If each of the frequency multipliers has a preferred multiplication factor of 3, then the IF signal is upconverted to an RF signal by 10 times the synthesizer frequency. This multiplication factor is a good compromise between hardware complexity and phase noise degradation resulting from the multiplication.

There are several distinct advantages of this circuit. First, the modulation signal $f_r$ is upconverted in frequency only by mixing in mixers 31, 42, and 52, and is not frequency multiplied in any circuit path, thus avoiding nonlinearities associated with frequency multipliers that cause distortion to the modulation signal. Because this frequency conversion circuit preserves signal linearity, it is suitable for various types of modulation such as FM, FSK, AM and QAM. Second, a low frequency synthesizer 38 with $f_{syn}$ in 1–5 GHz range can be used, which is much less expensive than a millimeter wave frequency synthesizer. Moreover, the tuning bandwidth of the frequency synthesizer 38 is multiplied by the composite multiplication factor of the cascaded frequency multipliers 46 and 48, resulting in a wide RF tuning bandwidth for the RF signal 54. Therefore, only one inexpensive low frequency synthesizer is needed to cover the radio's full tuning bandwidth.

In another embodiment, one frequency multiplier can be used instead of two cascaded multipliers 46 and 48. However, the multiplication factor would be limited with a single multiplier because phase noise degradation would become excessive with a multiplication factor that is greater than 5. Therefore, the synthesizer frequency $f_{syn}$ would have to be much higher, thus increasing the circuit's cost.

The frequency conversion circuit for the radio receiver is preferably the same as that of the transmitter except that the operation is reversed. A received RF signal 56 at a frequency $f_{IF}$+(M×N+1)$f_{syn}$ is downconverted in frequency by a mixer 58, which mixes the incoming RF signal 56 with a multiplied synthesizer frequency wave 60 resulting from a synthesizer 62's frequency $f_{syn}$ being multiplied in a cascade of multipliers 64 and 66. The downconverted signal 68 is then mixed with synthesizer frequency $f_{syn}$ in a mixer 70 to be further downconverted to an IF signal 72 at the frequency $f_{IF}$. The IF signal 72 is then mixed with the IF wave 32 from the local oscillator 34 in a mixer 74 to produce a baseband modulation signal 76 having a baseband frequency $f_r$. In a millimeter wave radio, one IF local oscillator 34 may be used for both transmission and reception using the same IF frequency. Moreover, the transmitter's and the receiver's frequency conversion circuits may use identical mixer and multiplier components for corresponding functions, thus further reducing the cost of manufacturing. If the transmitter and the receiver are remote from each other, separate local oscillators would need to be provided for both.

The advantages of the transmitter frequency conversion circuit described above also apply to the receiver circuit. The advantages include low signal distortion, low phase noise degradation, wide tuning bandwidth, and use of an inexpensive low frequency synthesizer.

While several illustrative embodiments of the invention have been shown and described, numerous variations and alternate embodiments will occur to those skilled in the art. Such variations and alternate embodiments are contemplated, and can be made without departing from the spirit and scope of the invention as defined in the appended claims.

We claim:

1. A signal conversion circuit for simultaneously converting a transmit baseband signal to a transmit signal and converting a receive signal to a receive baseband signal, comprising:

a transmit frequency-conversion circuit and a receive frequency-conversion circuit that each include:

a) first, second and third mixers that are serially connected with said second mixer positioned between said first and third mixers;

b) a frequency synthesizer connected to said second mixer; and c) at least one frequency multiplier connected between said frequency synthesizer and said third mixer; and a local oscillator connected between the first mixer of said transmit frequency-conversion circuit and the first mixer of said receive frequency-conversion circuit;

a transmit baseband signal that is coupled to the first mixer of said transmit frequency-conversion circuit being converted into said transmit signal at that circuit's third mixer; and a receive signal that is coupled to the third mixer of said receive frequency-conversion circuit being converted into said receive baseband signal at that circuit's first mixer.

2. The signal conversion circuit of claim 1, wherein said at least one frequency multiplier comprises two serially-connected frequency multipliers.

3. The signal conversion circuit of claim 2, wherein said serially-connected frequency multipliers each have a multiplication factor less than or equal to five.

4. The signal conversion circuit of claim 3, wherein said serially-connected frequency multipliers each have a multiplication factor of three.

5. A method for simultaneously converting a transmit baseband signal to a transmit signal and a receive signal to a receive baseband signal, comprising the steps of:

generating a local oscillator signal;

providing a frequency-conversion process that includes the processes of:
 a) generating a converter signal;
 b) multiplying said converter signal to generate a multiplied converter signal; and
 c) mixing an input signal with said local oscillator signal, said converter signal and said multiplied converter signal to generate a frequency-converted signal;

applying said frequency-conversion process to said transmit baseband signal wherein said input signal is said transmit baseband signal and said frequency-converted signal is said transmit signal; and simultaneously applying said frequency-conversion process to said receive signal wherein said input signal is said receive signal and said frequency-converted signal is said receive baseband signal.

6. The method of claim 5, wherein said multiplying step includes the step of multiplying twice with multiplication factors less than or equal to five.

7. The method of claim 5, wherein said multiplying step includes the step of multiplying twice with a multiplication factor of three.

8. The signal conversion circuit of claim 1, wherein said local oscillator generates a local oscillator signal having a frequency that is substantially higher than the frequency of said transmit baseband signal.

9. The signal conversion circuit of claim 1, wherein said local oscillator generates a local oscillator signal having a frequency that is substantially five times the frequency of said transmit baseband signal.

10. The method of claim 5, wherein said local oscillator generating step includes the step of causing the frequency of said local oscillator signal to be significantly higher than the frequency of said transmit baseband signal.

11. The method of claim 5, wherein said local oscillator generating step includes the step of causing the frequency of said local oscillator signal to be substantially five times the frequency of said transmit baseband signal.

* * * * *